(12) United States Patent
Shinoda et al.

(10) Patent No.: US 8,481,855 B2
(45) Date of Patent: Jul. 9, 2013

(54) FLEXIBLE WIRING SUBSTRATE

(75) Inventors: Koji Shinoda, Yao (JP); Hiroshi Nakagawa, Yao (JP)

(73) Assignee: Hosiden Corporation, Osaka (JP)

( * ) Notice: Subject to any disclaimer, the term of this patent is extended or adjusted under 35 U.S.C. 154(b) by 308 days.

(21) Appl. No.: 12/959,842

(22) Filed: Dec. 3, 2010

(65) Prior Publication Data
US 2011/0132642 A1    Jun. 9, 2011

(30) Foreign Application Priority Data
Dec. 9, 2009    (JP) .................................. 2009-279543

(51) Int. Cl.
*H01R 4/00*    (2006.01)

(52) U.S. Cl.
USPC ........ 174/71 R; 174/254; 174/257; 174/72 R; 361/749

(58) Field of Classification Search
USPC ............... 174/250, 254, 257, 70, 71 R, 72 R, 174/72 RT; 361/749
See application file for complete search history.

(56) References Cited

U.S. PATENT DOCUMENTS

| | | | | |
|---|---|---|---|---|
| 6,304,251 | B1 * | 10/2001 | Ito et al. | 345/173 |
| 7,108,515 | B2 * | 9/2006 | Tanabe et al. | 439/67 |
| 7,227,537 | B2 * | 6/2007 | Nakayama et al. | 345/173 |
| 7,455,529 | B2 * | 11/2008 | Fujii et al. | 439/67 |
| 7,629,537 | B2 * | 12/2009 | Ice | 174/254 |
| 7,948,762 | B2 * | 5/2011 | Castillo Garcia et al. | 361/749 |
| 2004/0061688 | A1 * | 4/2004 | Nakayama et al. | 345/173 |
| 2005/0219230 | A1 * | 10/2005 | Nakayama et al. | 345/173 |
| 2008/0158183 | A1 * | 7/2008 | Hotelling et al. | 345/173 |
| 2009/0161331 | A1 * | 6/2009 | Sato et al. | 361/803 |
| 2009/0283300 | A1 * | 11/2009 | Grunthaner | 174/254 |

FOREIGN PATENT DOCUMENTS
JP        3857278 B2    9/2006

* cited by examiner

*Primary Examiner* — Hoa C Nguyen
(74) *Attorney, Agent, or Firm* — The Webb Law Firm

(57) ABSTRACT

A plurality of protruding substrate portions (12) is extended from positions placed at an interval from each other along a peripheral edge of a wiring substrate (10). Each of the protruding substrate portions (12) is provided with wiring terminals (15), (16) electrically connected to each of a plurality of electrode terminals provided to an electrical instrument substrate. A cut-out part (18) is formed in a peripheral edge (13a) between the protruding substrate portions (12) in the wiring substrate (10).

4 Claims, 4 Drawing Sheets

FLEXIBLE WIRING SUBSTRATE

BACKGROUND OF THE INVENTION

1. Field of the Invention

The present invention relates to a flexible wiring substrate in which a plurality of protruding substrate portions is extended from positions placed at an interval from each other along a peripheral edge of a wiring substrate, and in which wiring terminals electrically connected to each of a plurality of electrode terminals provided to an electrical instrument substrate are provided to each of the protruding substrate portions.

2. Description of the Related Art

In the aforementioned flexible wiring substrate, the wiring terminals provided to each of the protruding substrate portions are electrically connected by an anisotropically conductive adhesive or other adhesive, for example, to the corresponding electrode terminals selected from among the plurality of wiring terminals provided to a touch panel substrate or other electrical instrument substrate. For example, in a conventional flexible wiring substrate such as the one described above, the relative positions of the pairs of protruding substrate portions are fixed in the direction along the planar surface of the wiring substrate, as described in Japanese Patent No. 3857278.

All of the wiring terminals provided to the plurality of protruding substrate portions can be positioned facing the corresponding electrode terminals provided to the electrical instrument substrate when an allowable range is maintained for the offset between the relative positions of the pairs of electrode terminals of the electrical instrument substrate oriented along the planar surface of the electrical instrument substrate and the relative positions of the pairs of wiring terminals provided to the protruding substrate portions oriented along the planar surface of the wiring substrate in such a flexible wiring substrate.

However, the relative positions of the pairs of protruding substrate portions are fixed in the direction along the planar surface of the wiring substrate. The wiring terminals provided to a single protruding substrate portion can therefore be positioned facing the corresponding electrode terminals when the offset between the aforementioned relative positions exceeds the allowable range, but all or some of the remaining wiring terminals provided to the remaining protruding substrate portions cannot be positioned facing the corresponding electrode terminals. Accordingly, a problem is encountered in that these wiring terminals cannot be electrically connected to the corresponding electrode terminals.

This problem can be solved by increasing the dimensions of the electrode terminals or the wiring terminals so as to increase the allowable range for the offset between the relative positions. However, a disadvantage of this method is an increased size of the protruding substrate portions or the area in which the electrode terminals are arranged on the electrical instrument substrate.

In view of the above-described situation, it is an object of the present invention to provide a flexible wiring substrate in which all of the wiring terminals provided to the plurality of protruding substrate portions are electrically connected with ease to the corresponding electrode terminals without increasing the size of the protruding substrate portions or the area in which the electrode terminals are arranged in the electrical instrument substrate.

SUMMARY OF THE INVENTION

According to a first aspect of the present invention, there is provided a flexible wiring substrate having a plurality of protruding substrate portions that extend from positions placed at an interval from each other along a peripheral edge of a wiring substrate, the corresponding protruding substrate portions being provided with wiring terminals electrically connected to each of a plurality of electrode terminals provided to an electrical instrument substrate, wherein the wiring substrate is provided with a cut-out part formed in a peripheral edge between the protruding substrate portions.

In the flexible wiring substrate according to this aspect, the pairs of wiring substrate portions provided facing each other across the interposed cut-out part can be displaced relative to each other in a direction along the planar surface of the wiring substrate. Accordingly, the relative positions can be easily corrected in a direction along the planar surface of the wiring substrate for the pairs of wiring terminals provided to the corresponding protruding substrate portions, and all of the wiring terminals provided to the protruding substrate portions can be easily positioned facing the corresponding electrode terminals provided to the electrical instrument substrate. All of the wiring terminals provided to the protruding substrate portions can thereby be electrically connected with ease to the corresponding electrode terminals without increasing the dimensions of the electrode terminals or the wiring terminals; specifically, without increasing the size of the protruding substrate portions or the area in which the electrode terminals are arranged on the electrical instrument substrate.

According to a second aspect of the present invention, the cut-out part is formed along an extension line of one side edge of one of the protruding substrate portions.

According to this aspect, the cut-out part is formed along an extension line of one side edge of one of the protruding substrate portions, whereby the protruding substrate portion can be easily displaced in a direction along the planar surface of the wiring substrate and in a direction orthogonal to the planar surface. Accordingly, the relative positions of the wiring terminals provided to the protruding substrate portions can be easily corrected.

According to a third aspect of the present invention, the cut-out part is formed in a slit shape.

According to this aspect, the protruding substrate portions provided with the wiring terminals can be easily displaced toward the slit-shaped cut-out part because the portions can be deformed at an angle about a region at the back of the slit-shaped cut-out part.

According to a fourth aspect of the present invention, at least one of the plurality of protruding substrate portions is provided with an engaged part capable of being engaged with a positioning jig for the electrode terminals.

According to this aspect, the protruding substrate portions provided with the engaged part can be easily displaced in a direction along the planar surface of the wiring substrate by causing the engaged part to engage with the positioning jig.

According to a fifth aspect of the present invention, a surface of one of the protruding substrate portions on which the wiring terminal is provided, and a surface of at least one other of the protruding substrate portions on which another wiring terminal is provided are positioned facing in opposite directions.

According to the present aspect, all of the wiring terminals provided to the plurality of protruding substrate portions can be positioned facing the corresponding electrode terminals provided to the electrical instrument substrate in cases in which the electrode terminals are provided to the front and back of the electrical instrument substrate, in cases in which a plurality of electrical instrument substrates is positioned facing each other, and the electrode terminals are provided to the surfaces facing each other, and in other cases.

According to a sixth aspect of the present invention, the plurality of protruding substrate portions extends from one side edge of the wiring substrate and the other side edge facing the one side edge, and the plurality of protruding substrate portions is placed at an interval from each other in a direction orthogonal to the extension direction; the cut-out part is formed in the side edge to which at least one of the protruding substrate portions is provided; and the protruding substrate portion is provided so as to be foldable toward a direction opposite from the extension direction thereof.

According to this aspect, the protruding substrate portion extending to one side edge is configured so as to be foldable toward a direction opposite from the extension direction thereof, whereby the manufacturing process can be simplified by providing a wiring terminal to the same surface of the protruding substrate portions, and the wiring terminals can be easily bonded to the electrical instrument substrate provided with electrode terminals on the front and back. In this case, the wiring terminals can be more easily positioned relative to the electrode terminals by properly adjusting the folding direction.

DETAILED DESCRIPTION OF THE PREFERRED EMBODIMENTS

Embodiments of the present invention will be described below based on the drawings.

Embodiment 1

Figure 1:
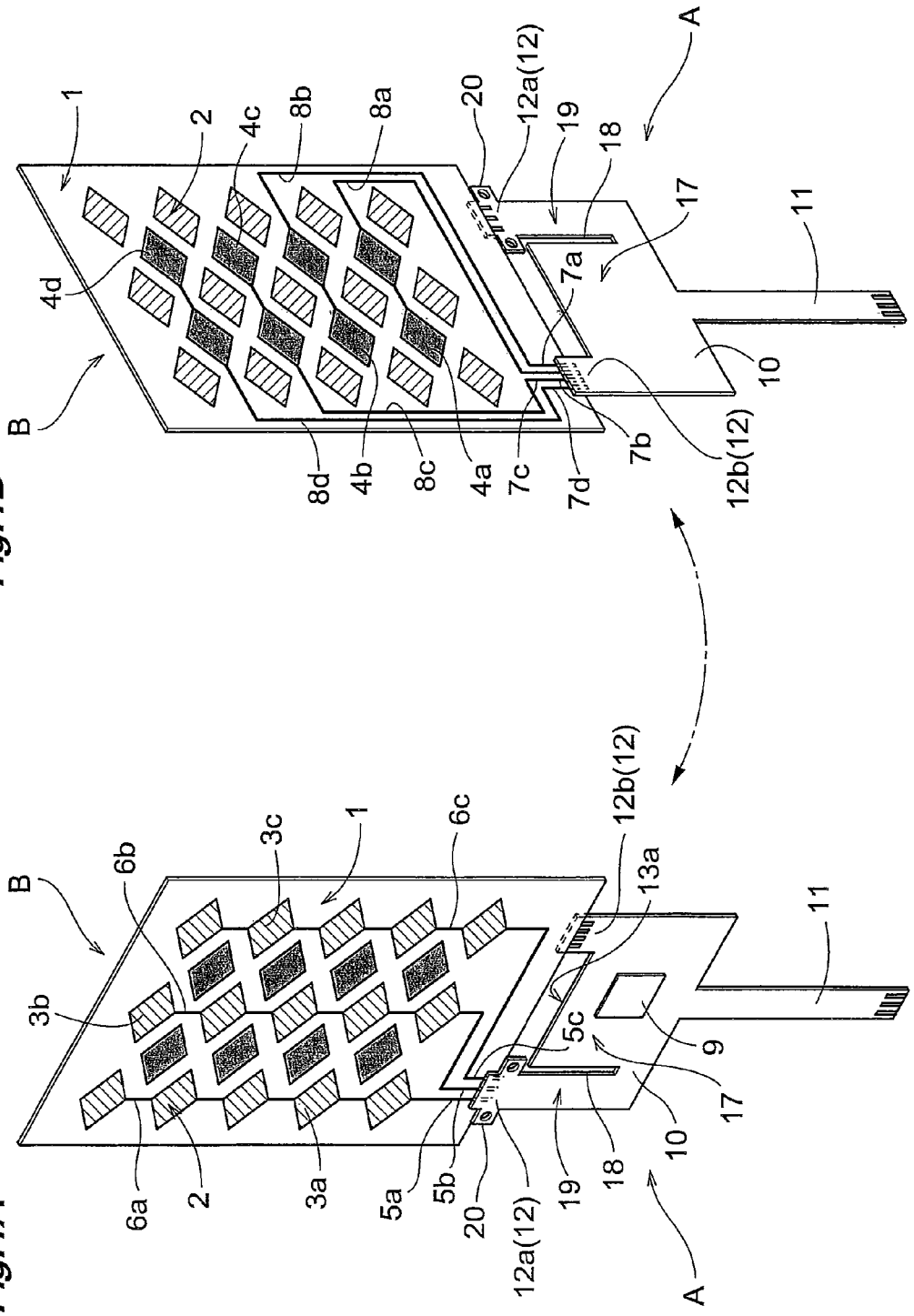
FIG. 1A is a perspective view showing a front surface of a touch panel.
FIG. 1B is a perspective view showing a back surface of a touch panel.

FIGS. 1A and 1B show a flexible wiring substrate A according to the present invention, and a touch panel B as an example of an electrical instrument connected to the flexible wiring substrate A. The touch panel B has a panel substrate (an example of an electrical instrument substrate) 1 formed of glass or a PET, PEN, or other polyester resin and provided with a capacitive sensor electrode 2. A touch panel B having a single panel substrate 1 is shown in the present embodiment, but a touch panel B obtained by laminating two or more panel substrates 1 may also be used.

The sensor electrode 2 is configured by arranging a plurality of x-row electrodes 3a to 3c arranged on the front surface of the panel substrate 1, and a plurality of y-row electrodes 4a to 4d arranged on the back surface of the panel substrate 1 in a mutually orthogonal matrix shape so as to be offset in a plane.

A cover panel (not shown) formed of glass, PET resin, or the like for covering each of the x-row electrodes 3 is provided to the front surface of the panel substrate 1 by using an adhesive. A had coating layer may be provided instead of the cover panel.

The touch panel B is configured so that when the front surface of the panel substrate 1 is touched by a finger between any of the x-row electrodes 3a to 3c and any of the y-row electrodes 4a to 4d, the corresponding change in capacitance between the x-row electrodes 3a to 3c and y-row electrodes 4a to 4d is measured, and the location touched by the finger on the front surface of the panel substrate 1 can be identified.

Each of the x-row electrodes 3a to 3c is individually connected by x-row wires 6a to 6c to x-row electrode terminals 5 (5a to 5c) arranged in parallel to each other along a peripheral edge of the front surface of the panel substrate 1. Each of the x-row electrodes 3a to 3c, the x-row wires 6a to 6c, and the x-row electrode terminals 5 (5a to 5c) is formed of a metallic film such as a silver film vapor-deposited or applied to the panel substrate 1.

Each of the y-row electrodes 4a to 4d is individually connected by y-row wires 8a to 8d to y-row electrode terminals 7 (7a to 7d) arranged in parallel to each other along a peripheral edge of the back surface of the panel substrate 1. Each of the y-row electrodes 4a to 4d, the y-row wires 8a to 8d, and the y-row electrode terminals 7 (7a to 7d) is formed of a metallic film such as a silver film vapor-deposited or applied to the panel substrate 1.

Figure 2:
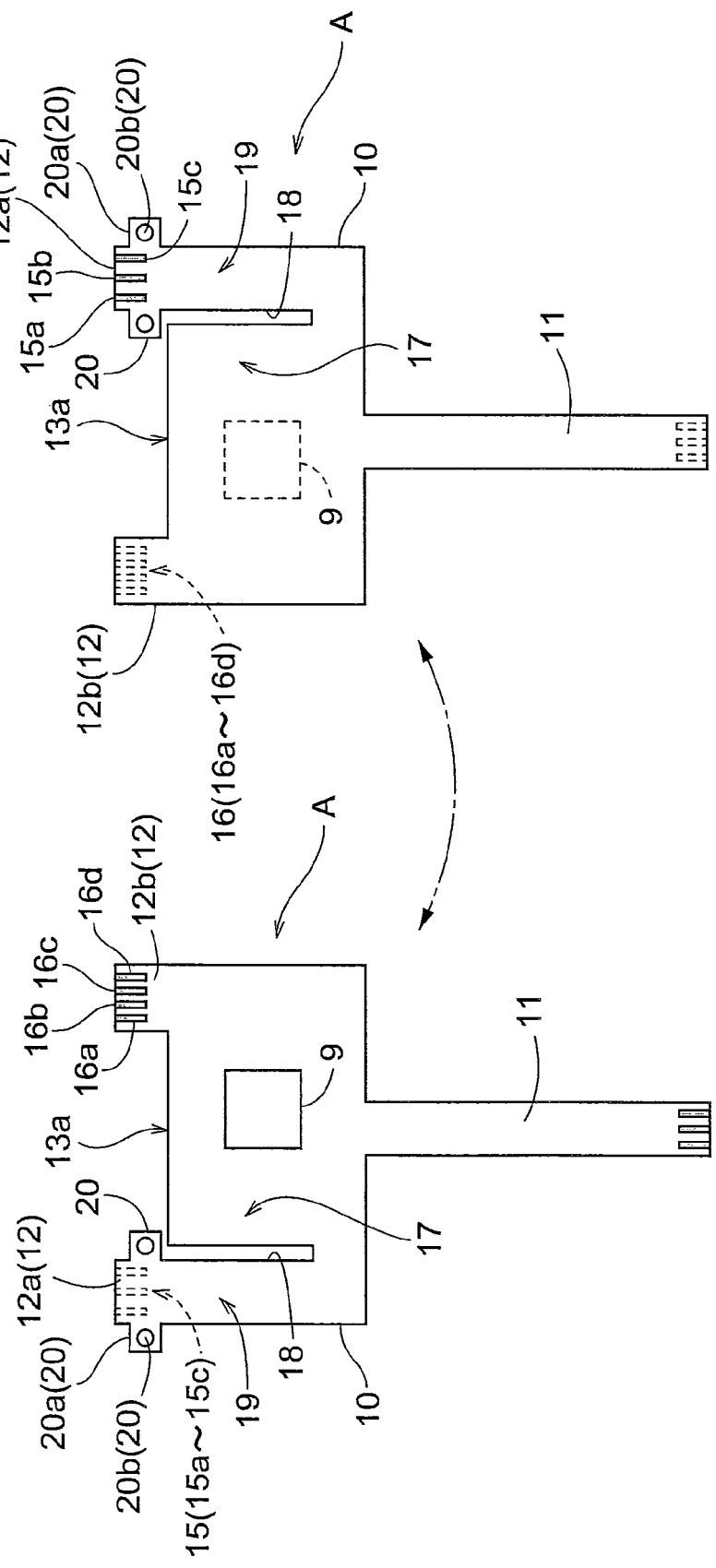
FIG. 2A is a plan view showing a front surface of a flexible wiring substrate.
FIG. 2B is a plan view showing a back surface of a flexible wiring substrate.

As shown in FIGS. 2A and 2B, the flexible wiring substrate A comprises a rectangular wiring substrate 10 provided on one side surface with an IC circuit 9 for processing signals from the touch panel B, and a belt-shaped cable 11 for connecting the IC circuit 9 to a controller and the like. In addition, a pair of protruding substrate portions 12 having a rectangular first protruding substrate portion 12a and a rectangular second protruding substrate portion 12b extends from positions placed at an interval from each other along one side edge 13a in a peripheral edge of the wiring substrate 10.

Figure 4:
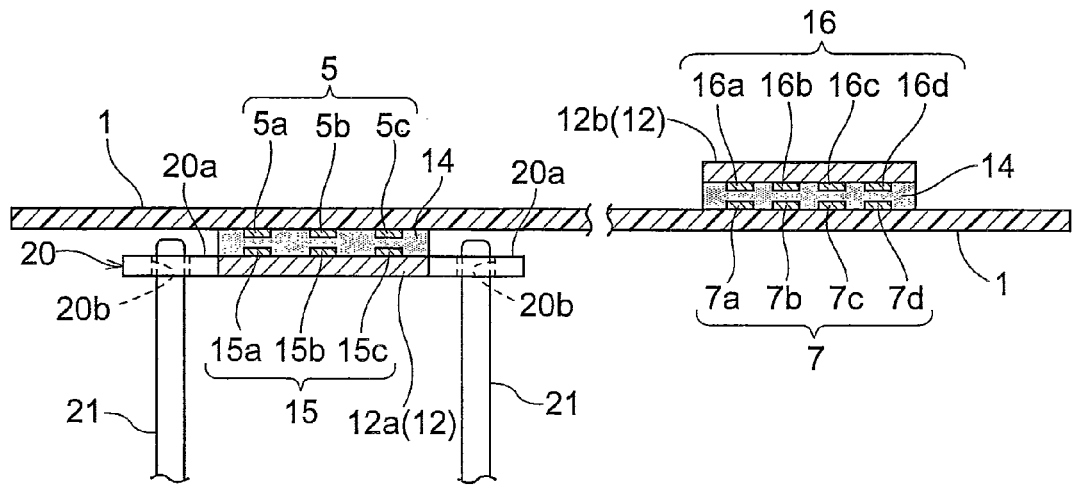
FIG. 4 is a cross-sectional view showing the connection structure between a wiring terminal of a flexible wiring substrate and an electrode terminal of a touch panel substrate.

As shown in FIG. 4, wiring terminals 15 (15a to 15c), 16 (16a to 16d) are provided to each of the first protruding substrate portion 12a and the second protruding substrate portion 12b; the wiring terminals 15 (15a to 15c), 16 (16a to 16d) being electrically connected by an anisotropically conductive adhesive 14 to the plurality of electrode terminals 5, 7, specifically, the plurality of x-row electrode terminals 5 (5a to 5c) and the plurality of y-row electrode terminals 7 (7a to 7d), provided to the panel substrate 1. The wiring terminals 15 (15a to 15c), 16 (16a to 16d) are formed of a metallic film such as a silver film vapor-deposited or applied to the protruding substrate portion 12.

The plurality of x-row wiring terminals 15 (15a to 15c) electrically connected in individual fashion to each of the plurality of x-row electrode terminals 5 (5a to 5c) is arranged in parallel to each other at the same interval as the alignment interval of the x-row electrode terminals 5 (5a to 5c) on a back surface (the side to which the IC circuit 9 is not provided) of the first protruding substrate section 12a. In addition, the plurality of x-row wiring terminals 15 (15a to 15c) is electrically connected to the IC circuit 9.

The plurality of y-row wiring terminals 16 (16a to 16d) electrically connected in individual fashion to each of the plurality of y-row electrode terminals 7 (7a to 7d) is arranged in parallel to each other at the same interval as the alignment interval of the y-row electrode terminals 7 (7a to 7d) on a front surface (the side to which the IC circuit 9 is provided) of the second protruding substrate section 12b. In addition, the plurality of y-row wiring terminals 16 (16a to 16d) is electrically connected to the IC circuit 9.

The wiring terminals 15, 16, of the two protruding substrate portions, specifically, the first protruding substrate portion 12a and the second protruding substrate portion 12b, are therefore provided to surfaces opposite each other.

A cut-out part 18 is formed in the side edge 13a between where the first protruding substrate portion 12a and the second protruding substrate portion 12b are provided to the wiring substrate 10 in the side edge of the wiring substrate 10.

The cut-out part 18 is formed along an extension line of the side edge of the first protruding substrate portion 12a on the side facing the second protruding portion 12b. The cut-out part 18 is also formed in a slit shape for dividing wiring substrate portions 17, 19 located facing each other across the interposed cut-out part 18.

Figure 3:
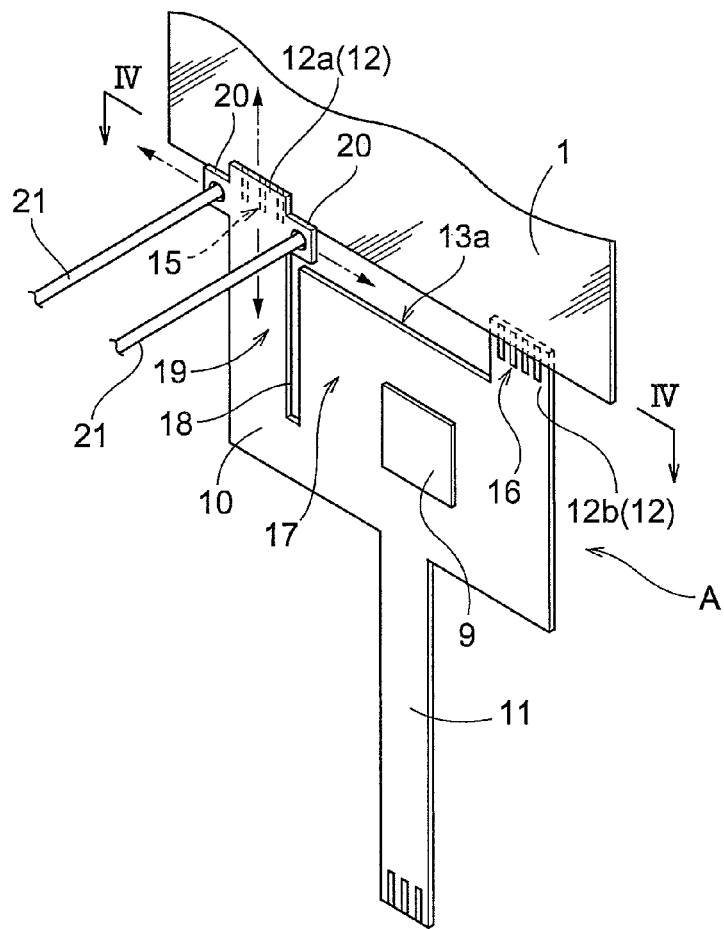
FIG. 3 is an explanatory view of a procedure for connecting a wiring terminal of a flexible wiring substrate to an electrode terminal of a touch panel substrate.

As shown in FIGS. 3 and 4, the first protruding substrate portion 12a includes an engaged part 20 capable of being engaged with a positioning jig 21 for the x-row electrode terminals 5. The engaged part 20 is configured by extending a protrusion 20a on both widthwise sides of the first protruding substrate portion 12a and forming an engaging hole 20b for engaging with an engaging pin or the like provided to the positioning jig 21 on the protrusion 20a.

As shown in FIG. 3, each of the y-row wiring terminals 16 arranged on the second protruding substrate portion 12b is electrically connected and fixed to the corresponding y-row electrode terminals 7 by the anisotropically conductive adhesive 14 when the panel substrate 1 and the wiring substrate 10 are connected together, and each of the x-row wiring terminals 15 is then positioned facing the corresponding x-row electrode terminals 5, with the anisotropically conductive adhesive 14 interposed therebetween. At this time, offsetting the x-row wiring terminals 15 and the corresponding x-row electrode terminals 5 relative to each other causes the pair of wiring substrate portions 17, 19 located facing each other across the interposed cut-out part 18 to be displaced relative to each other in a direction along the planar surface of the wiring substrate 10, and the relative positions to be corrected in a direction along the planar surface of the wiring substrate 10 for the x-row wiring terminals 15 and the y-row wiring terminals 16 provided to the corresponding protruding substrate portions 12a, 12b.

Accordingly, all of the wiring terminals 15, 16 provided to the corresponding protruding substrate portions 12a, 12b can be easily positioned facing the corresponding electrode terminals 5, 7 provided to the panel substrate 1, with the anisotropically conductive adhesive 14 interposed therebetween, without increasing the dimensions of the electrode terminals 5, 7 or the wiring terminals 15, 16; specifically, without increasing (widening) the area in which the electrode terminals 5, 7 are arranged on the panel substrate 1 or the protruding substrate portions 12 (12a, 12b). In addition, all of the wiring terminals 15, 16 provided to the corresponding protruding substrate portions 12a, 12b can be electrically connected with ease to the corresponding electrode terminals 5, 7 by the anisotropically conductive adhesive 14 without increasing the consumption of the anisotropically conductive adhesive 14.

FIG. 4 is a cross-sectional view along line IV and IV in FIG. 3. The view illustrates the connection structure between the flexible wiring substrate A and the panel substrate 1. As is apparent from the drawing, the x-row wiring terminals 15 (15a to 15c) provided to the first protruding substrate portion 12a are positioned facing the corresponding x-row electrode terminals 5 (5a to 5c), with the anisotropically conductive adhesive 14 interposed therebetween, and are electrically connected to the terminals. The y-row wiring terminals 16 (16a to 16d) provided to the second protruding substrate portion 12b are positioned facing the corresponding y-row electrode terminals 7a to 7d, with the anisotropically conductive adhesive 14 interposed therebetween, and are electrically connected to the terminals.

The anisotropically conductive adhesive 14 is used to bond the wiring terminals 15, 16 and the corresponding electrode terminals 5, 7 together under heating so as to establish electrical conduction between the two by pressure bonding, and insulation is maintained by sections not subjected to pressure. There is, therefore, no adverse effect on the insulation between the pairs of adjoining wiring terminals 15a to 15c, 16a-16d and the pairs of adjoining electrode terminals 5a to 5c, 7a to 7d.

Embodiment 2

Figure 5A:
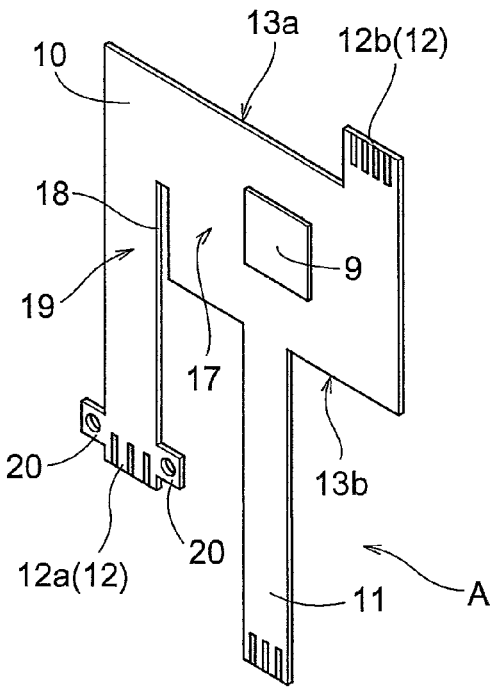
FIG. 5A is a perspective view showing a front surface of a flexible wiring substrate in a second embodiment.
Figure 5B:
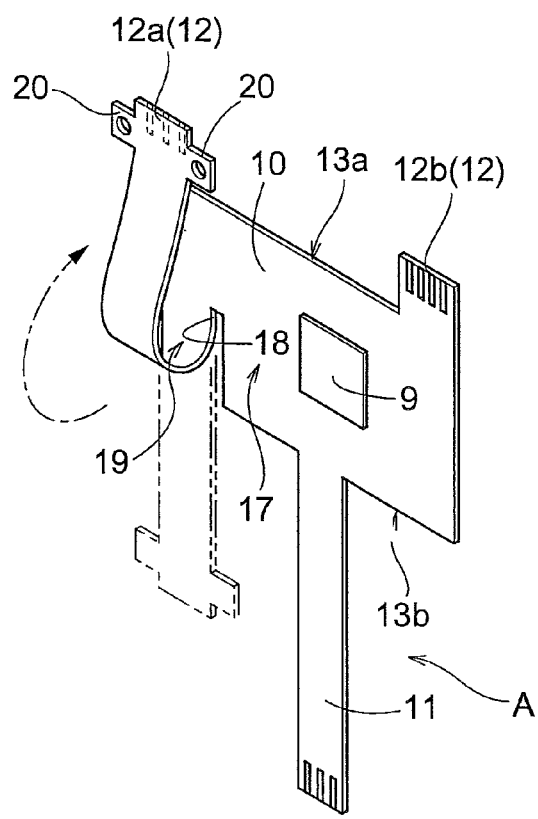
FIG. 5B is a perspective view showing the result of correcting the relative positions of pairs of wiring terminals of adjoining protruding substrate portions of a flexible wiring substrate in a second embodiment.

FIGS. 5A and 5B illustrate a second embodiment of the flexible wiring substrate A according to the present invention. As shown in FIG. 5A, the two protruding substrate portions 12, specifically, the first protruding substrate portion 12a and the second protruding substrate portion 12b, extend in directions opposite each other from the side edges 13a, 13b arranged opposite each other on the periphery of the rectangular wiring substrate 10.

The first protruding substrate portion 12a and the second protruding substrate portion 12b are arranged offset from each other in a direction orthogonal to the extension direction, that is, the direction along the side edges 13a, 13b; and the first protruding substrate portion 12a is extended farther than the second protruding substrate portion 12b.

The x-row wiring terminals 15 (15a to 15c) and the y-row wiring terminals 16 (16a to 16d) are arranged in parallel on the front surface of the protruding substrate portions 12 (the side to which the IC circuit 9 is provided).

The cut-out part 18 is formed along an extension line of the side edge of the first protruding substrate part 12a on the side facing the belt-shaped cable 11, and is positioned between the belt-shaped cable 11 and the first protruding substrate part 12a on the side edge 13b of the wiring substrate 10 provided with first protruding substrate part 12a. The cut-out part 18 is formed in a slit shape that separates the pair of wiring substrate portions 17, 19 located facing each other across the interposed cut-out part 18.

As shown in FIG. 5B, the pair of wiring substrate portions 17, 19 located facing each other across the interposed cut-out part 18 are then displaced in relative fashion in a direction along the planar surface of the wiring substrate 10, and the first protruding substrate portion 12a can be folded or elastically displaced so as to bend in a direction opposite the extension direction thereof, specifically, a direction toward the side edge 13a beyond which the second protruding substrate portion 12b is extended. The relative positions of the first protruding substrate portion 12a and the second protruding substrate portion 12b can thereby be corrected. The other structures are the same as those in the first embodiment.

Other Embodiments (1) In the flexible wiring substrate according to the present invention, the cut-out part may be formed in the wiring substrate in a central location between the pair of protruding substrate portions.

(2) In the flexible wiring substrate according to the present invention, three or more protruding substrate portions may be extended at an interval from each other along the periphery of the wiring substrate.

(3) In the flexible wiring substrate according to the present invention, a plurality of cut-out parts may be formed.

(4) In the flexible wiring substrate according to the present invention, the cut-out part may be formed so that the pair of wiring substrate portions located facing each other across the cut-out part are brought into contact with each other.

(5) In the flexible wiring substrate according to the present invention, all of the protruding substrate portions may include engaged parts capable of being engaged with a positioning jig for the electrode terminals.

(6) The flexible wiring substrate according to the present invention may be a flexible wiring substrate in which the wiring terminals electrically connected by the anisotropically conductive adhesive to the electrode terminals provided to a resistive touch panel substrate are provided to the protruding substrate portions.

What is claimed is:

1. A flexible wiring substrate comprising first and second protruding substrate portions that extend from positions placed at an interval from each other along a peripheral edge of a wiring substrate, the respective first and second protruding substrate portions being provided with corresponding wiring terminals electrically connected to each of a plurality of electrode terminals provided to an electrical instrument substrate, wherein
the wiring substrate includes a plurality of said peripheral edges;
the first and second protruding substrate portions are provided along the same peripheral edge;
the first and second protruding substrate portions are connected to the same electrical instrument substrate; and
the wiring substrate is provided with a cut-out part formed in a peripheral edge between the first and second protruding substrate portions, the cut-out part being in the form of a slit having a width narrower than the distance between the first and second protruding substrate portions.

2. The flexible wiring substrate according to claim 1, wherein the cut-out part is formed along an extension line of one side edge of the first or second protruding substrate portion.

3. The flexible wiring substrate according to claim 1, wherein at least one of the first or second protruding substrate portions is provided with an engaged part capable of being engaged with a positioning jig for the electrode terminals.

4. The flexible wiring substrate according to claim 1, wherein a surface of the first protruding substrate portion on which the wiring terminal is provided, and a surface of the second protruding substrate portion on which another wiring terminal is provided are positioned facing in opposite directions.

* * * * *